United States Patent
Arkin et al.

[11] Patent Number: 5,951,705
[45] Date of Patent: Sep. 14, 1999

[54] INTEGRATED CIRCUIT TESTER HAVING PATTERN GENERATOR CONTROLLED DATA BUS

[75] Inventors: Brian J. Arkin, Pleasanton; David Scott, Fremont; Ha Nguyen, San Jose, all of Calif.

[73] Assignee: Credence Systems Corporation, Fremont, Calif.

[21] Appl. No.: 08/962,419

[22] Filed: Oct. 31, 1997

(Under 37 CFR 1.47)

[51] Int. Cl.$^6$ ................................... G06F 11/00
[52] U.S. Cl. ............................ 714/738; 714/32
[58] Field of Search ................. 371/27.1, 22.35, 371/22.36, 22.6, 25.1, 27.5, 27.6, 27.7; 364/481, 489, 580; 395/183.07, 183.13, 183.19; 714/18, 25, 27, 31, 32, 721, 724, 734, 735, 738

[56] References Cited

U.S. PATENT DOCUMENTS

| | | | |
|---|---|---|---|
| 5,072,178 | 12/1991 | Masumoto | 324/158 R |
| 5,432,797 | 7/1995 | Takano | 371/27 |
| 5,481,549 | 1/1996 | Tokuyama | 371/27 |
| 5,499,248 | 3/1996 | Behrens et al. | 371/22.1 |
| 5,579,251 | 11/1996 | Sato | 364/579 |
| 5,590,137 | 12/1996 | Yamashita | 371/27 |
| 5,696,772 | 12/1997 | Lesmeister | 371/27 |
| 5,696,773 | 12/1997 | Miller | 371/28 |
| 5,701,306 | 12/1997 | Arai | 371/22.1 |
| 5,701,309 | 12/1997 | Gearhardt et al. | 371/25.1 |
| 5,796,753 | 8/1998 | Kato | 371/27.1 |

*Primary Examiner*—Robert W. Beausoliel, Jr.
*Assistant Examiner*—Nadeem Iqbal
*Attorney, Agent, or Firm*—Smith-Hill and Bedell

[57] ABSTRACT

An integrated circuit tester includes a host computer, a pattern generator and a set of tester circuits. The tester circuits perform test activities on an integrated circuit in response to sequences of test control data arriving via a set of data lines. The host computer may write parameter control data into the tester circuits via a bus telling the tester circuits how to adjust various parameters of test activities to be performed in response to a next arriving sequence of test control data. The host computer is also linked to the pattern generator via that same bus and writes pattern control data into the pattern generator via the bus. The pattern control data tells the pattern generator to generate alternating sequences of test control data and pattern control data. As it is generated, each test control data sequence is delivered to the tester circuits via the data lines to tell the tester circuits how to carry out a sequence of test activities. As each parameter control data sequence is generated, the parameter control data is written into the tester circuits via the bus to set the test parameters for a next sequence of test activities to be performed. Thus once programmed with pattern control data from the host, the pattern generator can cause the tester circuits to carry out a sequence of tests and to appropriately adjust their test parameters before each test without further assistance from the host computer.

20 Claims, 4 Drawing Sheets

INTEGRATED CIRCUIT TESTER HAVING PATTERN GENERATOR CONTROLLED DATA BUS

BACKGROUND OF THE INVENTION

1. Field of the Invention

The present invention relates in general to an integrated circuit tester employing a pattern generator to control activities of a pin electronics circuit during a test, and in particular to a tester using the pattern generator to also provide on-the-fly adjustment of test parameters before or during the test.

2. Description of Related Art

A typical integrated circuit (IC) tester includes a set of tester channels, one for each pin of an integrated circuit device under test (DUT). During each cycle of a test, each channel can either supply a digital test signal to the pin or monitor a DUT output signal produced at the pin to determine whether the DUT is behaving as expected during the test cycle. At the start of each test cycle, a large central pattern generator provides input channel data concurrently to all channels defining an action or actions to be taken at the DUT terminal during the test cycle. The channel data typically includes "format set" (FSET) data indicating what action or actions are to be taken during the test cycle and "time set" (TSET) data indicating a time or times during the test cycle at which the action is to be taken. When a channel is monitoring a DUT output signal during the test cycle a PG data value usually indicates the expected state or states of the DUT output signal. When the channel is to supply a test signal to the DUT terminal the PG data is sometimes used with the FSET data to provide additional bits for selecting the format of the test signal.

A pattern generator typically includes an addressable pattern memory for storing at each address all of the channel control data needed for one cycle of the test. A counter or sequencer within the pattern generator sequentially addresses the pattern memory during the test so that it reads out the pattern data for each cycle of the test. The pattern memory is connected to a host computer via a conventional computer bus so that the host computer can write pattern data provided by a user into the pattern memory before the test.

The host computer also uses that bus to write control data into addressable storage locations within various tester components other than the pattern memory. This control data adjusts test parameters to meet the requirements of the test to be performed. For example, since DUTs operate at various logic levels, testers typically allow the host to adjust test signal logic levels. Since DUTs operate at various supply voltages levels, a tester allows the host to adjust the DUT power supply voltage. Also in some systems the host can adjust the manner in which each tester channel responds to various combinations of values of FSET, TSET and PG channel data during a test by writing control data to memories within the tester channels controlling how the channels decode the FSET, TSET and PG data into signals that actually control channel activities during the cycle.

Logic tests are often performed repeatedly on a DUT with operating parameters being changed before each repetition. For example, if a DUT is rated as being operable with a supply voltage of 3 to 5 volts, DUT logic can be repeatedly tested at several different supply voltages between 3 and 5 volts to ensure that the DUT operates properly over its entire supply voltage range. Or if a DUT is supposed to respond to test signals having logic levels within a specified range, a logic test can be repeatedly performed at several logic levels within that range. Thus, after each logic test a host computer must write new control data into the tester to adjust its operating parameters and then signal the pattern memory to repeat the logic test.

Some tester can also perform other tests in addition to digital logic tests. For example, a tester may also perform a leakage current test to determine whether DUT leakage current is within an acceptable range or may be able to directly measure leakage current. In these testers a host computer can, for example, after having the tester perform a digital logic test on a DUT, send control data setting the tester up to perform a leakage current test on the same DUT and then initiate a leakage current test.

Thus a prior art tester can perform a series of tests on a DUT provided however that after each test, a host computer writes new control data into the tester to configure it for the next test and then signals the appropriate tester circuits to begin the test. However the time the host requires to write control data into the tester can be a significant part of the time required to test a DUT and it requires that the host be constantly involved in tester operation. It would be desirable if a tester could carry out a sequence of tests requiring reconfiguration of the tester between or during tests without involvement of the host computer.

SUMMARY OF THE INVENTION

An integrated circuit tester in accordance with the present invention performs a sequence of digital logic tests on an integrated circuit device under test (DUT). The tester includes a set of tester channels, each of which carries out digital logic test activities at a separate terminal of an integrated circuit device under test (DUT) during successive cycles of each test. A pattern generator, programmed by a host computer, supplies data to each tester channel for each test cycle telling the channel what to do during the test cycle. The tester includes other circuits controlling various parameters of the test in response to stored control data supplied as input thereto via a common bus.

In accordance with one aspect of the invention, while the host computer may provide the control data via the bus to the circuits controlling various test parameters before each test, the pattern generator may also supply control data to those circuits via that same bus. Moreover, the pattern generator may not only provide that parameter control data before each test begins but may also provide parameter control data during a test so as to change test parameters on the fly. Thus, the pattern generator output not only controls tester activities during digital logic tests, it can also adjust tester operating parameters between and during tests. Since it can reconfigure itself between tests, the tester may carry out a sequence of tests without assistance from the host computer.

The tester also includes additional test circuits for carrying out one or more tests other than a digital logic test on the DUT along with switching circuits for selectively connecting the additional tester circuits to the DUT terminals when the other tests are to be performed. In accordance with the invention, the pattern generator output data also controls the switching circuits so as to selectively connect those additional test circuits to the DUT terminals when such other tests are to be performed. Pattern generator output signals also initiate operation of those additional test circuits.

It is accordingly an object of the invention to provide an integrated circuit tester in which an internal pattern generator providing data controlling test activities also provides data for reconfiguring the tester between tests of a sequence of tests to be conducted on the DUT and initiates each test. The invention allows the tester to carry out a sequence of tests without involvement of the host computer between tests of the sequence, greatly improving tester throughput and allowing the host to be used for other purposes during the sequence of tests.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Tester Architecture

Figure 1:
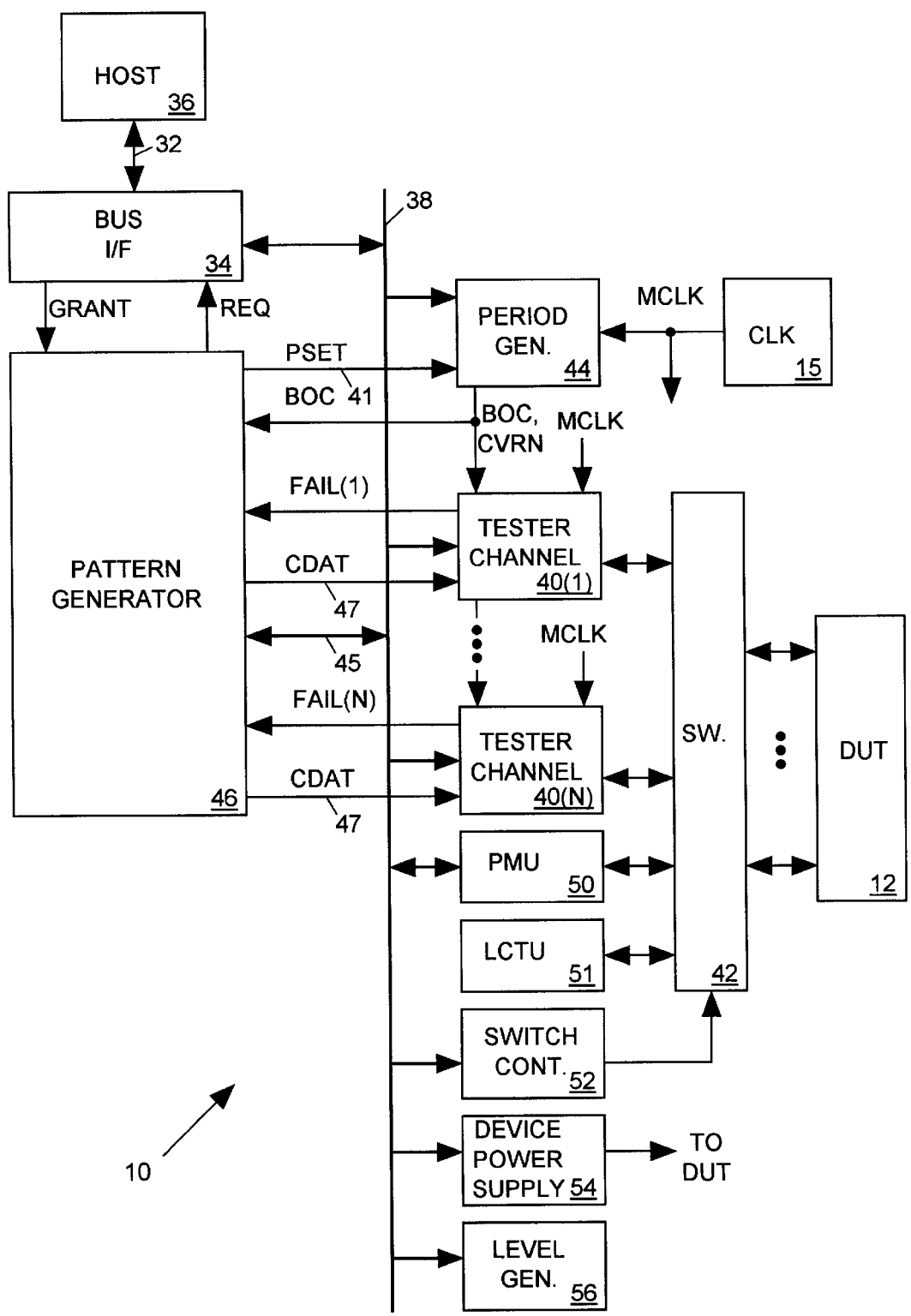
FIG. 1 illustrates a modular integrated circuit tester in accordance with the present invention.

FIG. 1 illustrates an integrated circuit tester 10 in accordance with the present invention for performing a sequence of tests on an integrated circuit device under test (DUT) 12 in response to data from an external host computer 36. Tester 10 includes a set of N tester channels 40(1)–40(N) each for carrying out test activities at a separate terminal of DUT 12 during digital logic tests. A switch circuit 42 selectively connects each channel 40(1)–40(N) to a corresponding DUT terminal. With a digital logic test organized into a set of successive test cycles, input channel data (CDAT) supplied to each tester channel 40(1)–40(N) via a set of data lines 47 at the start of each test cycle tells the channel how and when its output test signal is to change state during the test cycle, when to sample a DUT output signal during the test cycle, and what logic state the sampled DUT output is expected to have. Each channel 40(1)–40(N) produces an output FAIL(1)–FAIL(N) signal when it detects that a DUT output signal fails to exhibit an expected state during any cycle of the test.

Tester channels 40(1)–40(N) are synchronous circuits clocked by the MCLK signal from a clock source 15. A period generator 44, also clocked by the MCLK signal, produces output signals BOC and CVRN indicating when each test cycle begins. The duration of each test period is determined by input data PSET supplied via data lines 41 to period generator 44 just before the start of each period. Period generator 44 supplies the BOC and CVRN signals to each tester channel 40(1)–40(N). Before each cycle of a digital logic test, a pattern generator 46 supplies the CDAT data input to each channel 40(1)–40(N) and supplies the PSET input data to period generator 44. The BOC output signal from period generator 44 tells pattern generator 46 when to supply the PSET and CDAT values for a next test period. Pattern generator 46 also receives the FAIL(1)–FAIL(N) signals produced by tester channels 40(1)–40(N).

Tester 10 also includes a conventional parametric measurement unit (PMU) 50 for measuring leakage current at a terminal of DUT 12, a leakage current test unit (LCTU) 51 used in performing a pass/fail leakage current test on DUT 12, a controller 52 for switch 42, a power supply 54 for providing power to DUT 12, and a reference level generator 56 for supplying reference voltages to tester channels 40(1)–40(N) and LCTU 51. Channels 40(1)–40(N) use the reference voltages as standards when setting the logic levels of the test signals they supply to DUT 12 and when measuring the logic levels of the DUT signals the channels monitor.

The external host computer 36 is connected to a conventional bus interface circuit 34 within tester 10 through a conventional bus 32 such as for example an Ethernet bus. Host computer 36 provides data for controlling activities of various components of tester 10. Bus interface 34 receives control data and addressing information from host computer 36 via bus 32 and sends it via a conventional parallel computer bus 38 to the appropriate addressable data storage locations within the various components of tester 10 connected to bus 38. Data written into pattern generator 46 via link 45 from bus 38 defines the output PSET and CDAT sequence it is to generate during a digital logic test. Control data written into period generator 44 tells period generator 44 how to decode its PSET data input from pattern generator 46. Control data written into tester channels 40(1)–40(N) tells them how to respond to various values of the CDAT input from pattern generator 46 during a test. Control data written into PMU 50, device power supply 54 and reference level generator 56 controls various test parameters including, for example, test voltage levels used during logic and leakage current tests and DUT power supply voltage, and also initiates tests. Finally control data supplied to switch controller 52 before each test determines which tester components access the terminals of DUT 12.

In accordance with the invention, pattern generator 46 may also send control data to the various tester components via bus 38. Moreover, pattern generator 46 may do this not only before a test but also during the test as well so as to change test parameters on the fly. Thus the pattern generator 46 not only controls tester activities during digital logic tests, it may also adjust tester operating parameters between and during tests. This gives tester 10 the ability to reconfigure itself between or during tests so that tester 10 may carry out a sequence of tests without requiring reconfiguration assistance from the host computer 36. Thus tester 10, having once been programmed to carry out a sequence of tests, can do so repeatedly without further assistance from host 36. The invention not only reduces reconfiguration time between tests, it also allows host computer 36 more time to carry out other activities during the test sequence.

Pattern Generator

Figure 2:
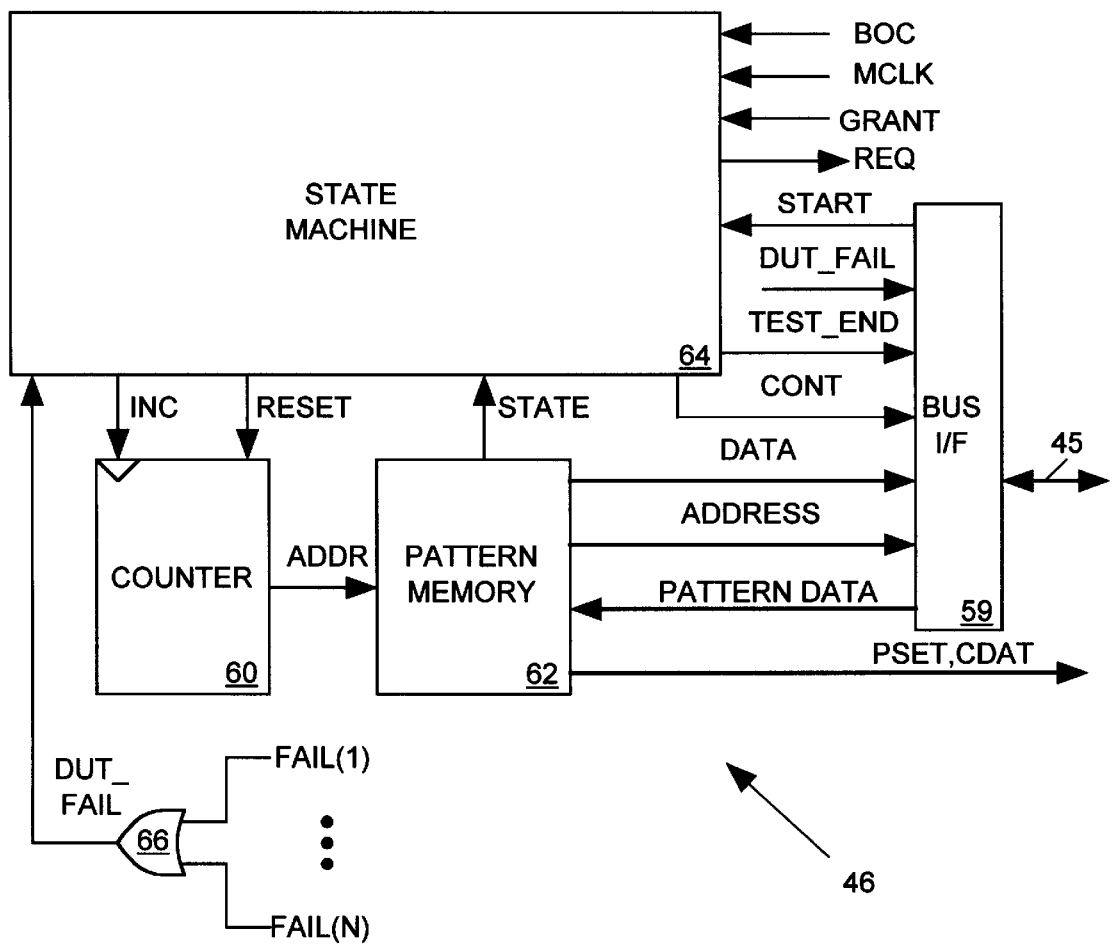
FIG. 2 illustrates the pattern generator of FIG. 1 in more detailed block diagram form.

FIG. 2 illustrates pattern generator 46 of FIG. 1 in more detailed block diagram form. During the set up process host 36 of FIG. 1 supplies pattern data to pattern generator 46 by transmitting it to a bus interface circuit 59 within pattern generator 46 via a link 45 to bus 38. Bus interface circuit 59 writes the data into an addressable pattern memory 62. Pattern data stored at any given address of pattern memory 62 may include CDAT and PSET data to be provided to period generator 44 and tester channels 40(1)–40(N) for one cycle of a digital logic test. Pattern data stored at any address of pattern memory may alternatively include parameter control data (DATA) to be written via bus 38 to a storage location within any of various tester components of FIG. 1 before the start of a test. The pattern data also includes a bus address (ADDRESS) of the storage location to which the parameter control data is to be written. Pattern data stored at all addresses in pattern memory 62 also includes a STATE data value supplied as input to a state machine 64 (or a sequencer) clocked by the MCLK signal. State machine 64 negotiates with bus interface 34 of FIG. 1 for access to bus 38 and controls a counter 60 for addressing pattern memory 62 during test sequences so that it reads out a sequence of stored pattern data.

To program tester 10 of FIG. 1 to perform a sequence of tests on DUT 12, host 36 writes data into pattern memory 62 via bus interface circuit 59. When a DUT is in place in the tester and ready to be tested, host 36 sends a start message via bus 38 causing bus interface circuit 59 to send a START signal to state machine 64. When state machine 64 receives the START signal it resets counter 60 so that counter 60 sets its output count (ADDR) to 0 thereby addressing the first storage location in pattern memory 62. That storage location contains a STATE data value telling state machine 64 that the current output of pattern memory 62 contains control data to be written into one of the devices connected to bus 38. State machine 64, responds to the STATE data by transmitting a bus request signal pulse (REQ) to bus interface 34 of FIG. 1. When bus 38 is available for use, bus interface circuit 34 transmits a sequence of GRANT signals to state machine 64. The GRANT signals cause state machine 64 to send a sequence of control signals to bus interface 59 telling it to send DATA and ADDRESS output of pattern memory 62 in the proper sequence through bus interface 59 and onto bus 38 of FIG. 1 via link 45. In a preferred embodiment of the invention, as bus interface 59 places the ADDRESS and DATA values data on bus 38, bus interface circuit 34 produces the control signals on bus 38 needed to write the DATA value into the storage location referenced by the ADDRESS value.

In an alternative embodiment of the invention, the DATA output of pattern memory 62 is not directly written into a tester device as bus interface 59 places it on bus 38. Instead bus interface circuit 34 first reads the ADDRESS and DATA values appearing on bus 38 and then rewrites the DATA value to the indicated bus address via bus 38. The alternative "two-step" process is preferred when various devices connected to bus 38 require differing bus access protocol. In such case, the bus access protocol employed depends on the bus address to which data is to be written. Since bus interface circuit 34 must have the capability to handle more than one bus protocol, it is convenient to allow bus interface circuit 34 to act as an intermediary when pattern generator 46 is to send control data to other devices connected to bus 38.

Once the DATA and ADDRESS outputs of pattern memory 62 have been sent out on bus 38, state machine 64 transmits a pulse (INC) to counter 60 causing it to increment the pattern memory 62 address so that the pattern memory reads out a next DATA value to be placed on a bus 38 along with associated ADDRESS and STATE values. The process continues with pattern memory 62 reading out a sequence of control data values that are written to various tester components until all components of tester 10 have been configured to conduct the first test of the sequence. If the first test is a digital logic test, the next addressed storage location of pattern memory 62 contains the PSET and CDAT data for the first cycle of the test. That data is delivered to period generator 44 and tester channels 40(1)–40(N). The STATE data output of pattern memory 62 tells state machine to then wait until it receives a BOC signal pulse from period generator 44 of FIG. 1 and to then increment counter 60. Pattern memory 62 then reads out the PSET and CDAT data for the next cycle of the test.

The process continues until the first test is complete. At that point the next set of addresses within pattern memory 62 contain all DATA and ADDRESS values needed to reconfigure the components of tester 10 for carrying out the next test, followed by the sequence of PSET,CDAT data needed for the second test. This setup/execution process is repeated for each test of the sequence. At the end of the last test of the sequence the STATE output of pattern memory 62 indicates that the test is at an end. This causes state machine 64 to send an output TEST_END signal to bus interface circuit 59 causing it to send a test end message to host 36 via link 45 to bus 38. State machine 64 then waits until it receives another START signal pulse before resetting counter 60 to start the test sequence over again.

At any time one of channels 40(1)–40(N) produces a FAIL(1)–FAIL(N) signal, indicating that DUT 12 of FIG. 1 has failed to perform as expected, an OR gate 66 produces an output DUT_FAIL signal to tell state machine 64 to stop the test and wait for another START signal. The DUT_FAIL signal also tells bus interface 59 to send a DUT fail message to host 36 via link 45 to bus 38.

Period Generator

Figure 3:
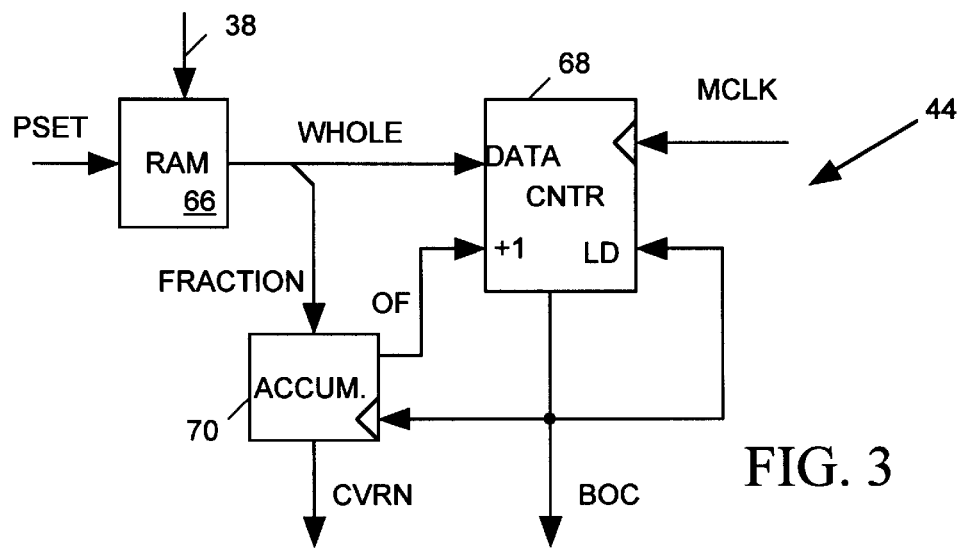
FIG. 3 illustrates the period generator of FIG. 1 in more detailed block diagram form.

FIG. 3 illustrates period generator 44 of FIG. 2 in more detailed block diagram form. Period generator 44 responds to the PSET output of pattern generator 46 by producing an output BOC signal and an output CVRN data value. The BOC signal indicates a last MCLK pulse preceding a start of a next test cycle while the CVRN data indicates a fractional portion of one MCLK cycle after that MCLK pulse that the next test cycle actually begins.

A main test cycle spans a whole and fractional number of master clock MCLK cycles. The PSET output of pattern generator 46 of FIG. 1 addresses a RAM 66 loaded with data from pattern generator 46 as it executes the setup instructions. RAM 66 acts as a lookup table to convert each of the 16 possible PSET values to data defining a test cycle length. The data output of RAM 66 of FIG. 3 includes WHOLE and FRACTION values respectively indicating the whole and fractional portions of the period of the next main test cycle. On the trailing edge of next BOC signal pulse, the WHOLE data is loaded into a counter 68 and the FRACTION value is accumulated by an accumulator 70. Counter 68 then begins counting MCLK signal pulses. When its count reaches WHOLE, counter 68 generates a next BOC pulse. The leading edge of the BOC pulse tells pattern generator 46 of FIG. 2 to produce a new PSET value, thereby causing RAM 66 to produce a WHOLE/FRACTION data pair for the next test cycle. Accumulator 70 accumulates successive FRACTION data values to produce the CVRN data. Accumulator 70 overflows when the accumulated CVRN data indicates a period greater than one MCLK cycle and provides an overflow signal OF to a +1 input of counter 68. When counter 68 next loads a WHOLE value it sets its count limit to WHOLE+1. Thus the BOC output of counter 68 indicates a last MCLK pulse preceding a start of a next test cycle while the CVRN data indicates a fractional portion of one MCLK cycle after that MCLK pulse that the next test cycle actually begins.

Tester Channel

Figure 4:
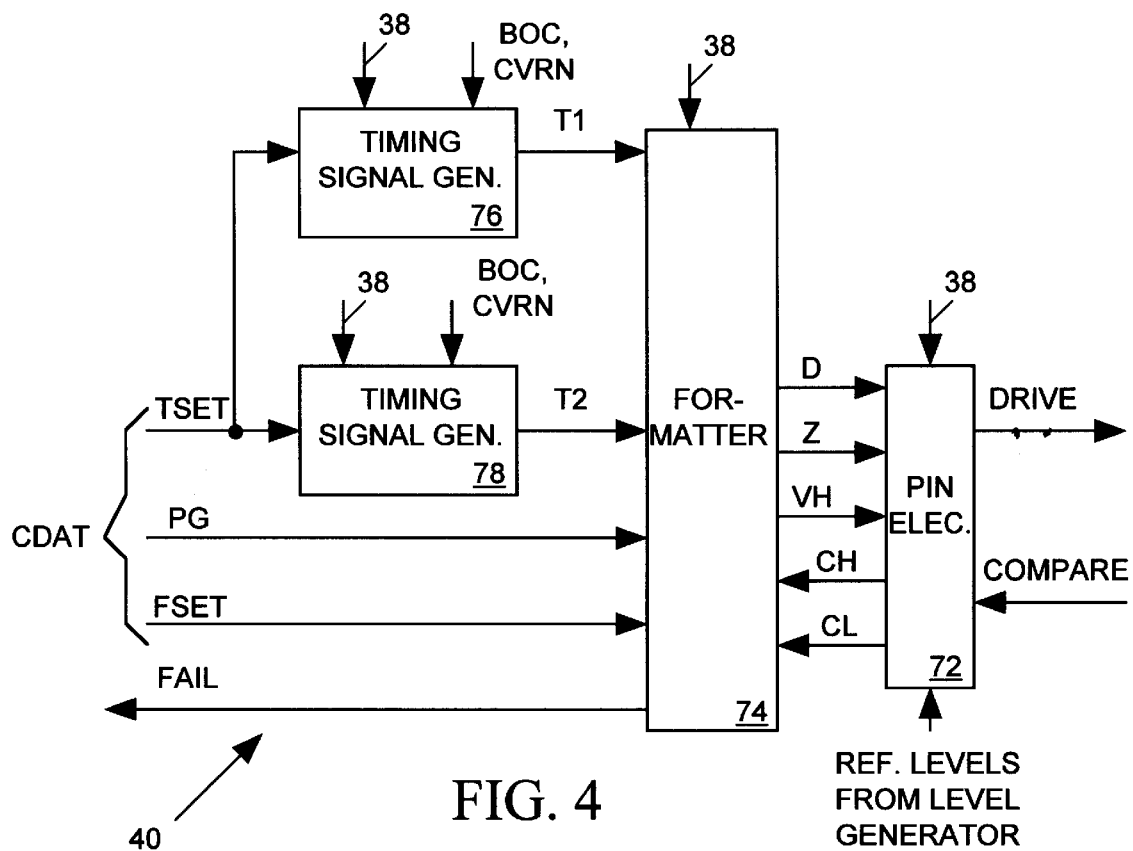
FIG. 4 illustrates a typical tester channel of FIG. 1 in more detailed block diagram form.

FIG. 4 illustrates tester 40(1) of FIG. 1 in more detailed block diagram form. Testers 40(2)–40(N) are similar. The channel data CDAT pattern generator 46 of FIG. 2 supplies to each channel 40(1)–40(N) for each test cycle includes format set data (FSET), time set data (TSET), and reference data (PG). The FSET data references a particular drive or compare format the channel is to use during the cycle. A drive format includes the manner in which the channel data determines successive test signal states during the test cycle and the manner in which the channel times test signal state changes. A compare format includes the manner in which the channel determines the expected states of the output signal and the manner in which the channel compares the output signal to its expected states and produces the FAIL(1)–FAIL(N) signal. The TSET data indicates certain times during a test cycle at which an event is to occur. A test may include, for example, a test signal state change or a DUT output signal comparison.

Tester channel 40(1) includes a pin electronics circuit 72 for supplying the test signal to the DUT terminal in response to a set of drive control signals (D, Z and VH). The D control signal tells the pin electronics circuit 72 whether to drive its output test signal (DRIVE) to a high or low logic level. The VH signal tells pin electronic circuit 72 whether to drive the DRIVE signal to a secondary voltage. The Z control signal tells pin electronics circuit 72 when to tristate the DRIVE signal. During each test cycle pin electronics circuit 72 also monitors the DUT output signal COMPARE from the DUT terminal and produces compare high and compare low signals (CH and CL) indicating whether the DUT output signal is currently above a high logic level or below a low logic level. Pin electronics circuit 72 uses signals from level generator 56 of FIG. 1 as references when determining the DUT's high and low logic levels.

In addition to pin electronics circuit 72, tester channel 40(1) includes a formatter circuit 74 and two timing signal generators 76 and 78. Each timing signal generator 76 or 78 receives TSET data from pattern generator 46 and the BOC and CVRN signals from period generator 44 at the start of each test cycle and pulses an output timing signal T1 or T2 once during each test cycle with a delay following the start of the test cycle indicated by the TSET data. The BOC and CVRN signals indicate when each test cycle begins.

Formatter circuit 74 receives the FSET data from pattern generator 46 and supplies the drive control signals D, Z and VH to pin electronics circuit 72 causing it to carry out a drive format indicated by the FSET data. When the FSET data references a drive format the PG data may indicate states to which the formatter is to set the drive control signals. The timing signals T1 and T2 indicate tell formatter circuit 74 when to adjust states of drive control signals D, Z and VH. When the FSET data references a compare format, formatter circuit 74 samples the CH and CL outputs of the pin electronics circuit at times indicated by the T1 and/or T2 timing signals and determines therefrom whether to assert its output FAIL(1) signal during the test cycle. In some compare formats the PG data references expected states of the CH and CL data.

Pattern generator 46 of FIG. 1 writes control data into timing signal generators 76 and 78 and formatter 74 via bus 38. The control data supplied to timing generators 76 and 78 relates a particular T1 and T2 timing signal pulse delay to each possible value of TSET. The programming data supplied to the formatter 74 of each channel relates a particular drive and control format to each possible combination of FSET and PG data.

Formatter

Figure 5:
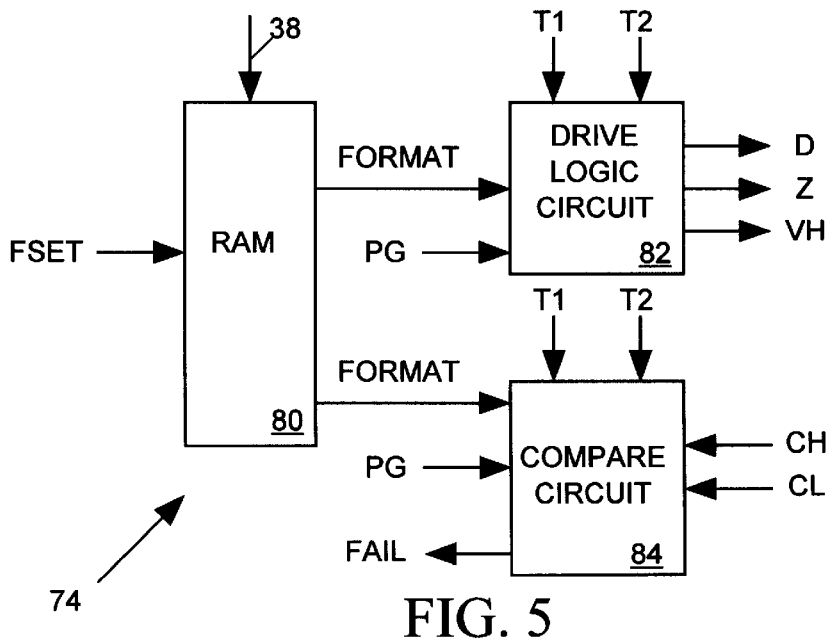
FIG. 5 illustrates the formatter of FIG. 4 in more detailed block diagram form.

FIG. 5 illustrates formatter 74 of FIG. 4 in more detailed block diagram form. Referring to FIG. 5, formatter 74 receives a 4-bit FSET data value from pattern generator 46 of FIG. 2 for each main test cycle. The FSET data indicates a particular test format to be carried out by a tester channel at the DUT terminal during the test cycle. The 4-bit FSET data value addresses a RAM 80, having 16 storage locations, one for each value of the FSET data. Before the test begins, pattern generator 46 of FIG. 1 writes format control data (FORMAT) in each storage location of RAM 80 via bus 38. Although each channel is capable of executing a large number of different types of test formats, the FSET data value supplied to the formatter 74 has only four bits and can only take on 16 different values. Thus the FSET data value can only represent 16 of the large number of different test formats formatter 74 can produce. The data stored in the 16 storage locations of RAM 80 determines which 16 of the many possible test formats channel 40 will be able to perform during the test. Since pattern generator 46 of FIG. 1 may write different control data into the RAM 80 of the formatter 74 of each tester channel 40(1)–40(N) of FIG. 1, the tester channels do not all have to be programmed for the same 16 formats.

During a test, when an incoming FSET data value addresses RAM 80, RAM 80 reads out a portion of the addressed FORMAT data to a drive logic circuit 82 and reads out another portion of the addressed FORMAT data to a compare logic circuit 84. The drive logic circuit 82 also receives the T1 and T2 timing signals from the timing generators 76 and 78 of FIG. 4 and the reference data bits PG of the channel data CDAT from pattern generator 46 of FIG. 1. Drive logic circuit 82 supplies the output D, Z and VH signals to pin electronics circuit 72 of FIG. 4 with the particular sequence of state changes in the D, Z and VH signals being controlled by the FORMAT data and with the timing of those state changes being controlled by the T1 and T2 timing signals. In some drive formats bits of the PG data indicate states to which the D, Z and/or VH signals are to be driven. In other drive formats, the new states of the D, Z and/or VH signals are specified by the format itself and are independent of the PG data.

The compare logic circuit 84 also receives the T1 and T2 timing signals and PG data as well as the compare high (CH) and compare low (CL) output signals of pin electronics circuit 72 of FIG. 4. The compare logic circuit 84 compares the CH and/or CL signals to their expected states and asserts the DUT_FAIL signal when the CH and CL signal states are not as expected during a test cycle. The FORMAT data controls the manner (format) in which compare logic circuit 84 carries out the comparison. The FORMAT data input to compare logic circuit selects the timing T1 and/or T2 timing signal that will control the timing of the comparison. In some compare formats the two-bit reference data PG indicates expected states CH and CL signal states. In other compare formats, the expected states are specified by the format itself and are independent of the PG data.

Leakage Current Measurement and Pass/Fail Tests

Figure 6:
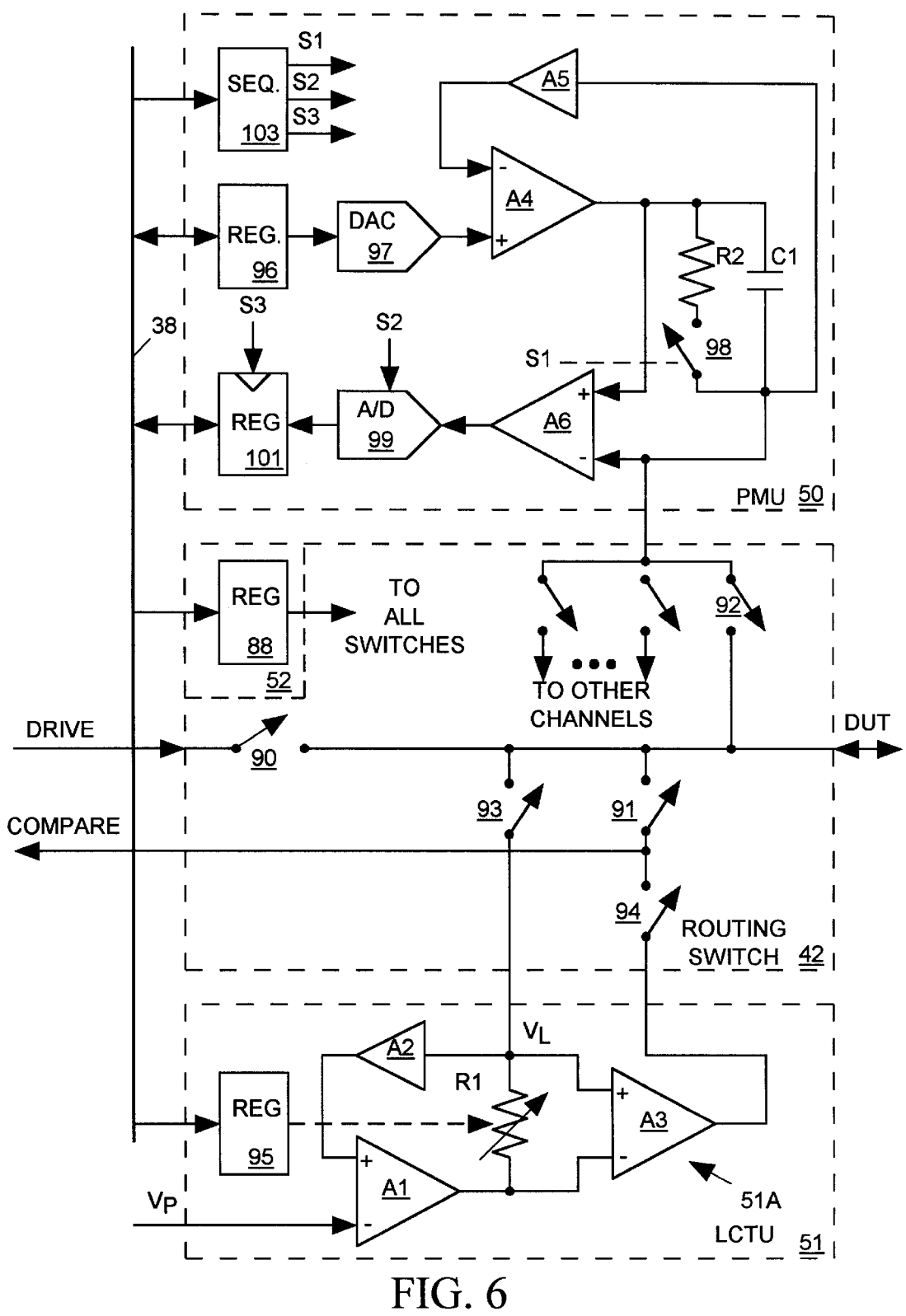
FIG. 6 illustrates the parametric measurement unit (PMU), the leakage current test unit (LCTU) and the routing switch of FIG. 1 in more detailed block diagram form.

FIG. 6 illustrates PMU 50, LCTU 52, switch controller 51 and routing switch 42 of FIG. 1 in more detailed block diagram form. Routing switch 42 selectively interconnects tester channels 40(1)–40(N), PMU 50 and LCTU 51 to the various DUT terminals. Switch positions are controlled by bits of control data pattern generator 46 of FIG. 1 writes into a register 88 of switch controller 52. During a digital logic test, a switch 90 is closed to connect the DRIVE signal output of the pin electronics circuit 72 (FIG. 4) of one of tester channels 40(1)–40(N) of FIG. 2 to the DUT terminal. A switch 91 is closed to provide the DUT output signal as the COMPARE signal input to pin electronics circuit 72 of FIG. 4. Switches 92, 93, and 94 are open to isolate PMU 50 and LCTU 51 from the DUT terminal.

LCTU 51 includes 48 voltage source circuits, each for providing a test voltage to a separate DUT terminal via routing switch 42 during a leakage current pass/fail test. Only one such voltage source circuit 51A is shown in FIG.

6. During the leakage current pass/fail test switches 90, 91 and 92 are open. Switch 93 is closed to permit an amplifier A1 within LCTU 51 to apply a test voltage $V_L$ to the DUT terminal through a variable resistor R1. Current into or out of the DUT terminal produces a voltage across resistor R1. An amplifier A3 in LCTU 51 amplifies the voltage developed across resistor R1 and supplies it via closed switch 94 as the COMPARE signal input to pin electronic circuit 72 (FIG. 4) of one of channels 40(1)–40(N). The channel 40(1)–40(N) asserts its output FAIL(1)–FAIL(N) signal if the voltage of the COMPARE signal is above predetermined threshold value, indicating that the current at the DUT terminal is outside a specified range. A reference voltage $V_P$ from level generator 51 of FIG. 2 indicating the desired level of $V_L$ is supplied to one input of differential amplifier A1. A unity gain amplifier A2 feeds $V_L$ back to the other input of amplifier A1. The feedback provided by amplifier A2 causes amplifier A1 to maintain $V_L$ at the desired test voltage $V_P$ regardless of the amount of leakage current through the DUT terminal. A register 95 stores set up data from pattern generator 46 of FIG. 1 for controlling the value of R1 during the test.

During a parametric leakage current measurement test, PMU 50 is connected through switch 92 to one of the DUT terminals to measure its leakage current. Switches 90, 91, 93 and 94 are held open. In the parametric test, a specified voltage at which the leakage current is to be measured is forced onto a DUT terminal and the resulting leakage current flow into or out of the DUT terminal is measured. Parametric tester 50 includes an addressable register 96 for storing control data provided by pattern generator 46 of FIG. 1 via bus 38 during system set up. The data value stored in register 96 drives a digital-to-analog converter (DAC) 97 providing a reference voltage to a differential amplifier A4. Amplifier A4 produces a voltage at the DUT terminal through a resistor R2 and switch 98 in parallel with a capacitor C1. With the voltage at the DUT terminal fed back to an input of amplifier A4 via a unity gain amplifier A5, amplifier A4 maintains the DUT terminal voltage at the level indicated by the output of DAC 97. An amplifier A6 amplifies the voltage developed across R2 to provide an input to a analog-to-digital (A/D) converter 99. A/D converter 99 digitizes the output of amplifier A6 and supplies it to a register 101 read accessed after the test sequence is complete by host computer 36 of FIG. 1 via bus 38. During the test, a sequencer 103 produces output control signals S1 and S2 for controlling switch 98 and register 101.

After storing data in register 88 of switch controller 52 to connect PMU 50 to a desired DUT terminal via switch 92, pattern generator 46 writes a data bit to sequencer 103 via bus 38 telling it to assert the S1 signal to close switch 98. Switch 98 discharges capacitor C1 and allows amplifier A4 to drive the DUT terminal to the test voltage. Sequencer 103 then deasserts S1 to open switch 98, allowing leakage current at the DUT terminal to charge capacitor C1. Amplifier A6 amplifies the voltage across C1. After a predetermined time, sequencer 103 briefly asserts an output signal S2 causing a A/D converter 99 to sample and convert the output of amplifier A6 to a digital quantity supplied to the input of a register 101. An output signal S3 of sequencer 103 tells register 101 to store the data output of A/D converter 99. After pattern generator 46 of FIG. 1 asserts the TEST_END signal to indicate the test sequence is complete, host 36 of FIG. 1 may read the data in register 101 via bus 38 and compute the leakage current. Leakage current is proportional to the sampled output voltage of amplifier A6 divided by the time C1 was allowed to charge, the interval between the time sequencer 103 turns off S1 and the time it pulses S2.

Thus has been shown and described an integrated circuit tester 10 that can be programmed to carry out a sequence of tests on a DUT and to automatically reconfigure itself before each test without intervention from a host controller. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for carrying out a sequence of test activities on an integrated circuit in response to input pattern control data from a host, apparatus comprising:

a bus;

testing means, connected to said bus, for carrying out said sequence of test activities in response to an input sequence of test data indicating said test activities, said testing means adjusting parameters of said test activities in response to parameter control data conveyed to said testing means on said bus;

a pattern generator connected to said bus; and bus interface means for receiving said input pattern control data from said host computer and for forwarding said input pattern control data to said pattern generator via said bus, wherein said pattern generator generates said sequence of test data in response to said pattern control data and supplies the generated sequence of test data to said testing means, thereby causing said test means to carry out said sequence of test activities, and wherein said pattern generator also generates parameter control data in response to said pattern control data and supplies the additional parameter control data to said testing means via said bus, thereby causing said testing means to adjust said parameters.

2. The apparatus in accordance with claim 1 wherein said pattern generator generates and supplies to said testing means a first portion of said sequence of test data, then generates and supplies to said testing means said parameter control data, and then generates and supplies to said testing means a next portion of said sequence of test data, such that said test means first carries out a first portion of said sequence of test activities, then adjusts said parameters, then carries out a next portion of said sequence of test activities.

3. The apparatus in accordance with claim 1 wherein said pattern generator supplies said sequence of test data to said testing means other than via said bus.

4. The apparatus in accordance with claim 1 wherein said testing means comprises a plurality of tester channels, each for carrying out test activities at a separate terminal of said integrated circuit device in response to said test data sequence.

5. The apparatus in accordance with claim 1 wherein said test activities carried out by said testing means comprise transmitting a test signal to said integrated circuit and wherein said test parameter comprises a voltage of said test signal.

6. A method for responding to input pattern control data from a host by carrying out a sequence of test activities on an integrated circuit and for adjusting parameters of those test activities before carrying them out, the method comprising the steps of:

delivering said input pattern control data via a bus to a pattern generator of the type which generates an output data pattern in response to said pattern control data, wherein the output data pattern includes alternating sequences of test data and parameter control data, wherein the test control data indicates test activities to be carried out on said integrated circuit and wherein the parameter control data indicates parameters of said test activities, transmitting the generated parameter control data on said bus, adjusting parameters of said test activities in accordance with the parameter control data transmitted on said bus, and carrying out the test activities in response to the generated test data.

7. An apparatus for carrying out a sequence of test activities on an integrated circuit, and for adjusting parameters of those test activities before carrying them out, the apparatus comprising:

a bus;

testing means, connected to said bus, for carrying out said sequence of test activities in response to an input test control data indicating said test activities, said testing means adjusting parameters of said test activities in response to parameter control data conveyed to said testing means on said bus before said testing means carries out said test activates;

a pattern generator, connected to said bus; and a host for providing output pattern control data and first parameter control data;

bus interface means, connected to said bus, for receiving said output parameter control data from said host and for forwarding said first parameter control data to said testing means via said bus such that said testing means adjusts test parameters of test activates performed thereafter in accordance with said parameter control data, and for receiving said input pattern control data from said host and forwarding said input pattern control data to said pattern generator via said bus, wherein said pattern generator generates first test control data in response to said pattern control data and supplies the first test control data to said testing means, thereby causing said test means to carry out a first sequence of test activities with said test parameters adjusted in accordance with said first parameter control data, wherein said pattern generator then generates second parameter control data in response to said pattern control data and supplies the additional parameter control data to said testing means via said bus, thereby causing said testing means to adjust said parameters in accordance with said second parameter control data, and wherein said pattern generator then generates second test control data in response to said pattern control data and supplies the second test control data to said testing means, thereby causing said test means to carry out a second sequence of test activities with said test parameters adjusted in accordance with said second parameter control data.

8. An apparatus for performing a test at terminals of an integrated circuit device under test (DUT), the apparatus comprising:

testing means for carrying out test activities at the DUT terminals in response to an test control data sequence identifying test activities to be performed at each terminal during the test, wherein a parameter of said test activities is controlled in accordance with first control data delivered into an addressable storage location included within said testing means;

a pattern generator for generating a pattern data sequence including a first portion generated before the test and a second portion generated during the test;

bus means for delivering into said addressable storage location prior to said test first control data included in said first portion of pattern data sequence; and means for delivering said second portion of said pattern data sequence as said test control data sequence to said testing means.

9. The apparatus in accordance with claim 8 wherein said testing means comprises a plurality of tester channels, each for carrying out test activities at a separate DUT terminal in response to separate portions of said test control data sequence.

10. The apparatus in accordance with claim 8 wherein said test activities carried out by said testing means comprise transmitting a test signal to one of said terminals and wherein said test parameter comprises a voltage of said test signal.

11. The apparatus in accordance with claim 8 further comprising switch means for selectively connecting said testing means to the DUT terminals in response to second control data included in said first portion of pattern data sequence and delivered to said switch means via said bus means before said test.

12. The apparatus in accordance with claim 8 wherein pattern data of said first portion includes an address value and a data value and wherein said bus means comprises:

a bus for conveying an address value, a data value and control signals;

bus interface means for generating a sequence of bus clock signal pulses and for concurrently sending at least one control signal via said bus in response to an input request signal; and means responsive to said sequence of bus clock signals for placing on said bus pattern data of said first portion generated by said pattern generator; and wherein said address value conveyed on said bus addresses said addressable storage location and said control signal causes said data value conveyed on said bus to be written into said addressable storage location.

13. The apparatus in accordance with claim 12 further comprising a bus for conveying input pattern control data to said bus interface means, wherein said bus interface means transmits the input pattern control data to said pattern generator, wherein said pattern generator stores said input pattern control data received via said bus and thereafter generates said pattern data sequence in response to the stored pattern control data.

14. An apparatus for successively performing a digital logic test and a parametric test at terminals of an integrated circuit device under test (DUT), the apparatus comprising:

digital logic testing means for carrying out the digital logic test in response to a test control data sequence identifying test activities to be performed at said terminals during the digital logic test, wherein a parameter of said test activities is controlled in accordance with first control data delivered into a first addressable storage location included within said digital logic testing means;

parametric testing means for performing the parametric test by generating and supplying to one of the DUT terminals a parametric test signal having a first parameter controlled by second control data stored in a second addressable storage location included in said parameter testing means and for thereupon measuring a second parameter of said signal;

switch means for selectively connecting said digital logic testing means and said parametric testing means to DUT terminals in response to third control data stored in a third addressable storage location included in said switch means;

a pattern generator for generating a pattern data sequence including a first portion generated before the digital logic test, a second portion generated during the digital logic test and a third portion generated before the parametric test;

bus means for delivering into said first addressable storage location first control data included in said first portion, for delivering into said second addressable storage location prior to said digital logic test third control data included in said first portion causing said switch means to connect said digital logic test means to said DUT terminal, for delivering into said second addressable storage location second control data included in said third portion, and for delivering into said third addressable storage location control data included in said third portion causing said switch means to connect said parametric testing means to said DUT terminal; and data lines for delivering said second portion of said pattern data sequence as said test control data sequence to said digital logic testing means during said digital logic test.

15. The apparatus in accordance with claim 14 wherein said digital logic testing means comprises a plurality of tester channels, each for carrying out test activities at a separate terminal of said DUT in response to separate portions of said test control data sequence.

16. The apparatus in accordance with claim 14 wherein said test activities carried out by said testing means comprise transmitting a test signal to a terminal of said DUT and wherein said test parameter comprises a voltage of said test signal.

17. The apparatus in accordance with claim 14 wherein pattern data of said first portion includes an address value and a data value and wherein said bus means comprises:

a first bus for conveying an address value, a data value and control signals;

bus interface means for generating a sequence of bus clock signal pulses and for concurrently sending at least one control signal via said first bus in response to an input request signal; and means responsive to said sequence of bus clock signals for placing on said bus pattern data of said first portion generated by said pattern generator; and wherein said address value conveyed on said bus addresses said addressable storage location and said control signal causes said data value conveyed on said first bus to be written into said addressable storage location.

18. The apparatus in accordance with claim 17 further comprising a second bus for conveying input pattern data to said bus interface means, wherein said bus interface transmits the input pattern data to said pattern generator via said second bus, wherein said pattern generator stores said input pattern data received via said second bus and thereafter generates said pattern data sequence in response to said pattern data.

19. The apparatus in accordance with claim 14 wherein said parametric testing means commences said parametric test in response to fourth control data included in said third portion and delivered to said parametric testing means via said first bus.

20. An integrated circuit tester comprising:

a bus;

a host connected to said bus;

a pattern generator connected to said bus;

a set of data lines; and a set of tester circuits connected to said bus and linked to said pattern generator via said set of data lines, wherein the tester circuits perform test activities on an integrated circuit in response to sequences of test control data arriving via said set of data lines wherein the host writes parameter control data into the tester circuits via said bus telling the tester circuits how to adjust various parameters of test activities to be performed in response to a next sequence of test control data arriving on said data lines, wherein the host also writes pattern control data into the pattern generator via said bus, wherein the pattern control data tells the pattern generator to generate alternating sequences of test control data and pattern control data, wherein as it is generated, each test control data sequence is delivered to the tester circuits via the data lines to tell the tester circuits how to carry out a sequence of test activities, and wherein as each parameter control data sequence is generated, the parameter control data included therein is written into the tester circuits via the bus to set the test parameters for a next sequence of test activities to be performed.

* * * * *